US012781089B2

(12) United States Patent
Yokoyama et al.

(10) Patent No.: US 12,781,089 B2
(45) Date of Patent: Nov. 3, 2026

(54) LOW-TEMPERATURE CURABLE NEGATIVE TYPE PHOTOSENSITIVE COMPOSITION

(71) Applicant: Merck Patent GmbH, Darmstadt (DE)

(72) Inventors: Daishi Yokoyama, Kakegawa (JP); Atsuko Noya, Kakegawa (JP); Cho-Ying Lin, Hukou Township (TW); Yung-Cheng Chang, Hukou Township (TW)

(73) Assignee: Merck Patent GmbH, Darmstadt (DE)

( * ) Notice: Subject to any disclaimer, the term of this patent is extended or adjusted under 35 U.S.C. 154(b) by 1283 days.

(21) Appl. No.: 17/629,473

(22) PCT Filed: Jul. 22, 2020

(86) PCT No.: PCT/EP2020/070607
§ 371 (c)(1),
(2) Date: Jan. 24, 2022

(87) PCT Pub. No.: WO2021/013859
PCT Pub. Date: Jan. 28, 2021

(65) Prior Publication Data

US 2022/0267641 A1 Aug. 25, 2022

(30) Foreign Application Priority Data

Jul. 25, 2019 (JP) ................................ 2019-136943

(51) Int. Cl.

| | |
|---|---|
| ***C09D 183/08*** | (2006.01) |
| ***G03F 7/032*** | (2006.01) |
| ***G03F 7/075*** | (2006.01) |
| ***G03F 7/16*** | (2006.01) |
| ***H10P 14/692*** | (2026.01) |

(52) U.S. Cl.
CPC ........... *C09D 183/08* (2013.01); *G03F 7/032* (2013.01); *G03F 7/0757* (2013.01); *G03F 7/168* (2013.01); *H10P 14/6922* (2026.01)

(58) Field of Classification Search
CPC . H01L 21/02126; G03F 7/168; G03F 7/0757; G03F 7/032; G03F 7/038; G03F 7/20; C09D 183/08; C09D 183/04; H10P 14/6922; H10P 14/6342; H10P 14/6686; C08G 77/26; C08L 33/00; C08L 83/04
USPC .......................................................... 438/781
See application file for complete search history.

(56) References Cited

U.S. PATENT DOCUMENTS

2015/0031808 A1* 1/2015 Huang .................... G03F 7/038 524/159
2019/0077961 A1 3/2019 Takahashi et al.
2020/0201179 A1 6/2020 Takahashi et al.
2020/0388413 A1 12/2020 Kushida et al.
2021/0191264 A1 6/2021 Tanigaki et al.

FOREIGN PATENT DOCUMENTS

CN 103782237 A 5/2014
CN 106918997 A 7/2017
CN 107850840 A 3/2018
EP 2538276 A1 12/2012
JP 2013-173809 A 9/2013
TW 201802594 A 1/2018
TW 201923463 A 6/2019

OTHER PUBLICATIONS

International Search Report and Written Opinion received for PCT Patent Application No. PCT/EP2020/070607, mailed on Oct. 27, 2020, 6 pages.

* cited by examiner

*Primary Examiner* — Monica D Harrison
(74) *Attorney, Agent, or Firm* — Faegre Drinker Biddle & Reath LLP

(57) ABSTRACT

To provide a negative type photosensitive composition having excellent chemical resistance and capable of being cured at a low temperature. A negative type photosensitive composition comprising (I) a polysiloxane having a specific structure, (II) a polymerization initiator, (III) a compound containing two or more (meth)acryloyloxy groups, and (IV) a solvent.

9 Claims, No Drawings

LOW-TEMPERATURE CURABLE NEGATIVE TYPE PHOTOSENSITIVE COMPOSITION

CROSS-REFERENCE TO RELATED APPLICATIONS

This application is a national stage application (under 35 U.S.C. § 371) of PCT/EP2020/070607, filed Jul. 22, 2020, which claims benefit of Japanese Application No. 2019-136943, filed Jul. 25, 2019, both of which are incorporated herein by reference in their entirety.

BACKGROUND OF THE INVENTION

Technical Field

The present invention relates to a negative type photosensitive composition. Further, the present invention relates to a method for producing a cured film using the same, a cured film formed therefrom, and an electronic device comprising the cured film.

Background Art

In recent years, various proposals have been made on optical devices such as displays, light-emitting diodes, and solar cells for the purpose of improving light use efficiency and saving energy. For example, in a liquid crystal display, a method for increasing the aperture ratio of display devices, which comprises forming a transparent planarization film on a thin film transistor (hereinafter, sometimes referred to as TFT) device to cover the device and forming a pixel electrode on the planarization film, is known.

Further, a structure in which a touch panel is formed on an organic EL or liquid crystal module has been proposed. Furthermore, a flexible display using a plastic substrate instead of a glass substrate has attracted attention. In any case, it is desirable that the film formation on a device is performed at a lower temperature so that the constituent material of the device is not thermally degraded. In addition, when forming a coating on an organic semiconductor, an organic solar cell, or the like, capability to be cured at a lower temperature is required in consideration of the environment. However, for example, in the field of touch panels, as a panel reliability test, it is set as acceptance conditions that normal function can be achieved even if a constant voltage is applied for a certain period of time under high temperature and high humidity conditions. Therefore, it is known that ordinary acrylic polymer cures at a low temperature but many of them do not have the resistance and properties required by customers.

Polysiloxane is known for its high temperature resistance. When forming and curing a coating film using a composition comprising polysiloxane, it is required to lower the curing temperature depending on the constituent materials of the device. In general, in order to obtain a coating film having high temperature and high humidity resistance, it is necessary to heat the coating film at a high temperature to rapidly promote and complete the condensation reaction of a silanol group in the polysiloxane and the reaction of the polymer having an unsaturated bond. If unreacted reactive groups remain, they may react with chemicals used in the device manufacturing process. Further, the adhesion to the substrate is sometimes deteriorated. Various polysiloxane compositions that maintain chemical resistance and can be cured at a low temperature have been proposed (for example, Patent Document 1). It has been desired to develop a composition comprising polysiloxane that can be further cured at a low temperature, while maintaining chemical resistance.

PRIOR ART DOCUMENTS

Patent Documents

[Patent document 1] JP-A 2013-173809

SUMMARY OF THE INVENTION

Problems to be Solved by the Invention

The present invention has been made in view of the above circumstances, and its object is to provide a negative type photosensitive composition having excellent chemical resistance and capable of being cured at a low temperature.

Means for Solving the Problems

The negative type photosensitive composition according to the present invention comprises:

(I) a polysiloxane A comprising a repeating unit represented by the formula (Ia):

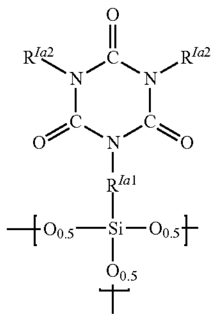

(Ia)

(wherein, $R^{Ia1}$ is an alkylene group having 1 to 5 carbon atoms, wherein $—CH_2—$ in the alkylene group may be replaced with —O—, $R^{Ia2}$ is each independently hydrogen, an alkyl group having 1 to 5 carbon atoms, or an alkylene group having 1 to 5 carbon atoms, wherein $—CH_2—$ in the alkyl group and the alkylene group may be replaced with —O—, and when $R^{Ia2}$ is alkylene, a bond not bonded to nitrogen is bonded to Si contained in another repeating unit represented by the formula (Ia)), (II) a polymerization initiator, (III) a compound containing two or more (meth)acryloyloxy groups, and (IV) a solvent.

The method for producing a cured film according to the present invention comprises applying the above-described composition onto a substrate to form a coating film, exposing the coating film, and developing.

The cured film according to the present invention is one formed by the above-described method.

The electronic device according to the present invention comprises the above-described cured film.

Effects of the Invention

The negative type photosensitive composition of the present invention can be cured at a temperature lower than the temperature range adopted for a general photosensitive composition capable of thermosetting, and can form a cured film having high chemical resistance. Further, a cured film or pattern can be manufactured at lower cost without requiring a heating process after exposure. Then, since the obtained cured film has excellent flatness and electrical insulation properties, it can be suitably used as a planarization film for a thin film transistor (TFT) substrate used as, first, backplanes of displays, such as liquid crystal display devices and organic EL display devices, or interlayer insulating films of semiconductor devices; as various film-forming materials, such as insulating films and transparent protective films, which are for solid state imaging devices, anti-reflection films, anti-reflection plates, optical filters, high-brightness emitting diodes, touch panels and solar cells; and further as an optical devices such as an optical waveguide.

DETAILED DESCRIPTION OF THE INVENTION

Mode for Carrying out the Invention

Embodiments of the present invention are described below in detail.

In the present specification, symbols, units, abbreviations, and terms have the following meanings unless otherwise specified.

In the present specification, unless otherwise specifically mentioned, the singular form includes the plural form and "one" or "that" means "at least one". In the present specification, unless otherwise specifically mentioned, an element of a concept can be expressed by a plurality of species, and when the amount (for example, mass % or mol %) is described, it means sum of the plurality of species. "And/or" includes a combination of all elements and also includes single use of the element.

In the present specification, when a numerical range is indicated using "to" or "–", it includes both endpoints and units thereof are common. For example, 5 to 25 mol % means 5 mol % or more and 25 mol % or less In the present specification, the hydrocarbon means one including carbon and hydrogen, and optionally including oxygen or nitrogen. The hydrocarbyl group means a monovalent or divalent or higher valent hydrocarbon. In the present specification, the aliphatic hydrocarbon means a linear, branched or cyclic aliphatic hydrocarbon, and the aliphatic hydrocarbon group means a monovalent or divalent or higher valent aliphatic hydrocarbon. The aromatic hydrocarbon means a hydrocarbon comprising an aromatic ring which may optionally not only comprise an aliphatic hydrocarbon group as a substituent but also be condensed with an alicycle. The aromatic hydrocarbon group means a monovalent or divalent or higher valent aromatic hydrocarbon. Further, the aromatic ring means a hydrocarbon comprising a conjugated unsaturated ring structure, and the alicycle means a hydrocarbon having a ring structure but comprising no conjugated unsaturated ring structure.

In the present specification, the alkyl means a group obtained by removing any one hydrogen from a linear or branched, saturated hydrocarbon and includes a linear alkyl and branched alkyl, and the cycloalkyl means a group obtained by removing one hydrogen from a saturated hydrocarbon comprising a cyclic structure and optionally includes a linear or branched alkyl in the cyclic structure as a side chain.

In the present specification, the aryl means a group obtained by removing any one hydrogen from an aromatic hydrocarbon. The alkylene means a group obtained by removing any two hydrogens from a linear or branched, saturated hydrocarbon. The arylene means a hydrocarbon group obtained by removing any two hydrogens from an aromatic hydrocarbon.

In the present specification, the descriptions such as "$C_{x-y}$", "$C_x$-$C_y$" and "$C_x$" mean the number of carbons in the molecule or substituent group. For example, $C_{1-6}$ alkyl means alkyl having 1 to 6 carbons (such as methyl, ethyl, propyl, butyl, pentyl and hexyl). Further, the fluoroalkyl as used in the present specification refers to one in which one or more hydrogen in alkyl is replaced with fluorine, and the fluoroaryl is one in which one or more hydrogen in aryl are replaced with fluorine.

In the present specification, when polymer has a plural types of repeating units, these repeating units copolymerize. These copolymerization are any of alternating copolymerization, random copolymerization, block copolymerization, graft copolymerization, or a mixture of any of these.

In the present specification, "%" represents mass % and "ratio" represents ratio by mass.

In the present specification, Celsius is used as the temperature unit. For example, 20 degrees means 20 degrees Celsius.

In the present specification, polysiloxane means polymer including a bond of Si—O—Si (siloxane bond) as a main chain. Further, in the present specification, silsesquioxane polymer represented by the formula $(RSiO_{1.5})_n$ shall also be included as the general polysiloxane.

Negative Type Photosensitive Composition

The negative type photosensitive composition according to the present invention (hereinafter sometimes simply referred to as the composition) comprises (I) polysiloxane having a specific structure, (II) a polymerization initiator, (III) a compound containing two or more (meth)acryloyloxy groups, and (IV) a solvent. Hereinafter, each component contained in the composition according to the present invention is described in detail.

(I) Polysiloxane A

The polysiloxane A used in the present invention comprises a repeating unit represented by the formula (Ia):

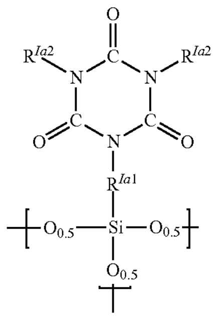

(Ia)

wherein, $R^{Ia1}$ is an alkylene group having 1 to 5 carbon atoms, wherein —$CH_2$— in the alkylene group may be replaced with —O—, but preferably is not replaced with —O—, $R^{Ia2}$ is each independently hydrogen, an alkyl group having 1 to 5 carbon atoms, or an alkylene group having 1 to 5 carbon atoms, wherein —$CH_2$— in the alkyl group and the alkylene group may be replaced with —O—, but preferably is not replaced with —O—, and when $R^{Ia2}$ is alkylene, a bond not bonded to nitrogen is bonded to Si contained in another repeating unit represented by the formula (Ia).

In addition, when the alkyl group or the alkylene group contains —O—, the total number of carbon atoms and oxygen atoms is 1 to 5.

$R^{Ia1}$ includes a methylene group, an ethylene group, and a propylene group, and is preferably a propylene group.

$R^{Ia2}$ includes hydrogen, a methyl group, an ethyl group, a propyl group, a methylene group, an ethylene group and a propylene group, and is preferably a propyl group and a propylene group.

Two $R^{Ia2}$ contained in one repeating unit can be identical or different, and at least one is preferably an alkylene group. In other words, it is preferable that an isocyanurate ring has a structure in which two polysiloxane chains are crosslinked. More preferably, both of two $R^{Ia2}$ are alkylene groups, and even more preferably, both of two $R^{Ia2}$ are propylene groups.

Preferably, the polysiloxane A further comprises a repeating unit represented by the formula (Ib):

(Ib)

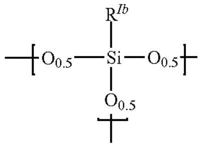

wherein, $R^{Ib}$ represents hydrogen, a $C_{1-30}$ linear, branched or cyclic, saturated or unsaturated, aliphatic hydrocarbon group or aromatic hydrocarbon group, the aliphatic hydrocarbon group and the aromatic hydrocarbon group may be each substituted with fluorine, hydroxy or alkoxy, and —$CH_2$— in the aliphatic hydrocarbon group and the aromatic hydrocarbon group may be replaced with —O— or —CO—, provided that $R^{Ib}$ is neither hydroxy nor alkoxy.

In addition, the above-described —$CH_2$— (methylene group) includes terminal methyl as well.

Further, the above "can be substituted with fluorine, hydroxy or alkoxy" means that a hydrogen atom directly bonded to a carbon atom in an aliphatic hydrocarbon group or an aromatic hydrocarbon group may be replaced with fluorine, hydroxy or alkoxy. In the present specification, the same applies to other similar descriptions.

Examples of $R^{Ib}$ include (i) alkyl, such as methyl, ethyl, propyl, butyl, pentyl, hexyl, heptyl, octyl and decyl, (ii) aryl, such as phenyl, tolyl and benzyl, (iii) fluoroalkyl, such as trifluoromethyl, 2,2,2-trifluoroethyl, 3,3,3-trifluoropropyl, (iv) fluoroaryl, (v) cycloalkyl, such as cyclohexyl, (vi) an oxygen-containing group having an epoxy structure such as glycidyl, or an acryloyl structure or a methacryloyl structure. Preferred are methyl, ethyl, propyl, butyl, pentyl, hexyl, phenyl, tolyl, glycidyl and isocyanate. As fluoroalkyl, perfluoroalkyl is preferred, and particularly trifluoromethyl or pentafluoroethyl is preferred. It is preferable that $R^{Ib}$ is methyl, because the raw material is easily available, the film hardness after curing is high, and the chemical resistance is high. Further, it is preferable that $R^{Ib}$ is phenyl, because the solubility of the polysiloxane in the solvent is increased and the cured film is less likely to crack.

The polysiloxane A used in the present invention can comprise a repeating unit represented by the formula (Ic):

(Ic)

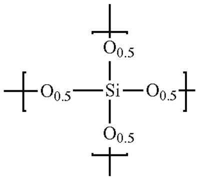

When the blending ratio of the repeating unit represented by the formula (Ic) is high, the photosensitivity of the composition decreases, the compatibility with solvents or additives decreases, and the film stress increases, so that cracks are likely to occur. For this reason, its content is preferably 40 mol % or less, more preferably 20 mol % or less, based on the total number of the repeating units of the polysiloxane A.

The polysiloxane A used in the present invention can comprise a repeating unit represented by the formula (Id):

(Id)

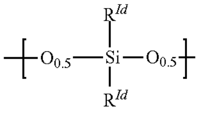

wherein, $R^{Id}$ each independently represents hydrogen, a $C_{1-30}$ linear, branched or cyclic, saturated or unsaturated, aliphatic hydrocarbon group or aromatic hydrocarbon group, the aliphatic hydrocarbon group and the aromatic hydrocarbon group can be substituted with fluorine, hydroxy or alkoxy, and —$CH_2$— in the aliphatic hydrocarbon group and the aromatic hydrocarbon group may be replaced with —O— or —CO—, provided that $R^{Id}$ is neither hydroxy nor alkoxy.

Examples of $R^{Id}$ include (i) alkyl, such as methyl, ethyl, propyl, butyl, pentyl, hexyl, heptyl, octyl and decyl, (ii) aryl, such as phenyl, tolyl and benzyl, (iii) fluoroalkyl, such as trifluoromethyl, 2,2,2-trifluoroethyl, 3,3,3-trifluoropropyl, (iv) fluoroaryl, (v) cycloalkyl, such as cyclohexyl, (vi) an oxygen-containing group having an epoxy structure, such as glycidyl, or an acryloyl structure or a methacryloyl structure. Preferred are methyl, ethyl, propyl, butyl, pentyl, hexyl, phenyl, tolyl, glycidyl and isocyanate. As fluoroalkyl, perfluoroalkyl is preferred, and particularly trifluoromethyl and pentafluoroethyl are preferred. It is preferable that $R^{Id}$ is methyl, because the raw material is easily available, the film hardness after curing is high, and the chemical resistance is high. Further, it is preferable that $R^{Id}$ is phenyl, because the solubility of the polysiloxane in the solvent is increased and the cured film is less likely to crack.

Through having the repeating unit represented by the above formula (Id), the polysiloxane used in the present invention can have a partially linear structure. However, since the heat resistance is reduced, it is preferable that the linear structure portion is small. Specifically, the amount of the repeating unit represented by the formula (Id) is preferably 30 mol % or less, more preferably 10 mol % or less, based on the total number of the polysiloxane repeating units. It is also one preferable aspect of the present invention that no repeating unit represented by the formula (Id) is contained.

The polysiloxane A used in the present invention has a structure in which repeating units as described above and blocks are bonded, but preferably has silanol at its terminal. Such a silanol group is obtained by bonding —$O_{0.5}H$ to a bond of the above-described repeating unit or block.

The larger the number of the repeating units represented by the formula (Ia) contained in polysiloxane A is, the better the adhesion to the substrate becomes, so that this is preferable. Further, in order to control the solubility in the developer, the smaller, the more preferable. Specifically, the total number of Si atoms of the formula (Ia) contained in the polysiloxane A is preferably 1 to 15%, more preferably 2 to 5%, based on the total number of Si atoms in the polysiloxane.

The mass average molecular weight of the polysiloxane A used in the present invention is not particularly limited.

On the other hand, the lower the molecular weight is, the less the synthesis conditions are limited and the easier the synthesis is, and it is difficult to synthesize polysiloxane having a very high molecular weight. For these reasons, the mass average molecular weight of polysiloxane is usually 1,500 to 20,000, and preferably 2,000 to 15,000 in view of the solubility in an organic solvent and the solubility in an alkali developer. Here, the mass average molecular weight is a mass average molecular weight in terms of polystyrene, which can be measured by gel permeation chromatography based on polystyrene.

Method for Synthesizing the Polysiloxane A

The method for synthesizing the polysiloxane A used in the present invention is not particularly limited, but it can be obtained, for example, by hydrolyzing and polymerizing a silane monomer represented by the following formula (ia) optionally in the presence of an acidic catalyst or a basic catalyst:

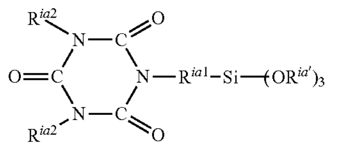

(ia)

(wherein, $R^{ia2}$ is each independently hydrogen, an alkyl group having 1 to 5 carbon atoms, or $-R^{ia1}—Si—(OR^{ia'})_3$, wherein $—CH_2—$ in the alkyl group may be replaced with —O—, $R^{ia1}$ is an alkylene group having 1 to 5 carbon atoms, wherein $—CH_2—$ in the alkylene group may be replaced with —O—, and $R^{ia'}$ is each independently linear or branched, $C_{1-6}$ alkyl).

Preferred $R^{ia1}$ is the same as the preferred $R^{Ia1}$ described above.

Preferred $R^{ia'}$ includes methyl, ethyl, n-propyl, isopropyl, n-butyl and the like. In the formula (ia), a plurality of $R^{ia'}$ are contained, and each $R^{ia'}$ can be identical or different.

Preferred $R^{ia2}$ can be selected from those described as preferable in the above-described $R^{Ia2}$ and those described as preferable as the above-described $R^{ia1}$.

Exemplified embodiments of the silane monomer represented by the formula (ia) include, for example, tris-(3-trimethoxysilylpropyl) isocyanurate, tris-(3-triethoxysilylpropyl) isocyanurate, tris-(3-tripropyloxysilylpropyl) isocyanurate, tris-(3-trimethoxysilylethyl) isocyanurate, tris-(3-triethoxysilylethyl) isocyanurate, tris-(3-tripropoxyoxysilylethyl) isocyanurate, tris-(3-trimethoxysilylmethyl) isocyanurate, tris-(3-triethoxysilylmethyl) isocyanurate, tris-(3-tripropoxysilylmethyl) isocyanurate, bis-(3-trimethoxysilylpropyl) methyl isocyanurate, bis-(3-triethoxysilylpropyl) methyl isocyanurate, bis-(3-tripropoxysilylpropyl) methyl isocyanurate, bis-(3-trimethoxysilylethyl) methyl isocyanurate, bis-(3-triethoxysilylethyl) methyl isocyanurate, bis-(3-tripropoxysilylethyl) methyl isocyanurate, bis-(3-trimethoxysilylmethyl) methyl isocyanurate, bis-(3-triethoxysilylmethyl) methyl isocyanurate, bis-(3-tripropoxysilylmethyl) methyl isocyanurate, 3-trimethoxysilylpropyl dimethyl isocyanurate, 3-triethoxysilylpropyl dimethyl isocyanurate, 3-tripropoxysilylpropyl dimethyl isocyanurate, 3-trimethoxysilylethyl dimethyl isocyanurate, 3-triethoxysilylethyl dimethyl isocyanurate, 3-tripropoxysilylethyl dimethyl isocyanurate, 3-trimethoxysilylmethyl dimethyl isocyanurate, 3-triethoxysilylmethyl dimethyl isocyanurate, and 3-tripropoxysilylmethyl dimethyl isocyanurate. Among them, tris-(3-trimethoxysilylpropyl) isocyanurate and tris-(3-triethoxysilylpropyl) isocyanurate are preferable.

Furthermore, it is preferable to combine a silane monomer represented by the formula (ib):

$$R^{ib}—Si—(OR^{ib'})_3 \qquad \text{(ib)}$$

wherein, $R^{ib}$ represents hydrogen, a $C_{1-30}$ linear, branched or cyclic, saturated or unsaturated, aliphatic hydrocarbon group or aromatic hydrocarbon group, the aliphatic hydrocarbon group and the aromatic hydrocarbon group can be substituted with fluorine, hydroxy or alkoxy, and $—CH_2—$ in the aliphatic hydrocarbon group and the aromatic hydrocarbon group may be replaced with —O— or —CO—, provided that $R^{ib}$ is neither hydroxy nor alkoxy, $R^{ib'}$ is each independently linear or branched, $C_{1-6}$ alkyl. It is also preferable to combine two or more silane monomers represented by the formula (ib).

Preferred $R^{ib}$ is the same as the preferred $R^{Ib}$ described above.

Preferred $R^{ib'}$ includes methyl, ethyl, n-propyl, isopropyl, n-butyl, and the like. In the formula (ib), a plurality of $R^{ib'}$ are contained, and each $R^{ib'}$ can be identical or different.

Furthermore, a silane monomer represented by the following formula (ic) can be combined. When the silane monomer represented by the formula (ic) is used, polysiloxane containing the repeating unit (Ic) can be obtained.

$$Si(OR^{ic'})_4 \qquad \text{(ic)}$$

wherein, $R^{ic'}$ is linear or branched, $C_{1-6}$ alkyl. In the formula (ic), preferred $R^{ic'}$ includes methyl, ethyl, n-propyl, isopropyl, n-butyl, and the like. In the formula (ic), a plurality of $R^{ic'}$ are contained, and each $R^{ic'}$ can be identical or different.

Exemplified embodiments of the silane monomer represented by the formula (ic) include tetramethoxysilane, tetraethoxysilane, tetraisopropoxysilane, tetra-n-butoxysilane, and the like.

Furthermore, a silane monomer represented by the following formula (id) can be combined. When the silane monomer represented by the formula (id) is used, polysiloxane containing the repeating unit (Id) can be obtained.

$$(R^{id})_2—Si—(OR^{id'})^2 \quad \text{(id)}$$

wherein, $R^{id'}$ is each independently linear or branched, $C_{1-6}$ alkyl, and examples thereof include methyl, ethyl, n-propyl, isopropyl, n-butyl, and the like. A plurality of $R^{id'}$ are contained in one monomer, and each $R^{id'}$ can be identical or different, $R^{id}$ each independently represents hydrogen, a $C_{1-30}$ linear, branched or cyclic, saturated or unsaturated, aliphatic hydrocarbon group or aromatic hydrocarbon group, the aliphatic hydrocarbon group and the aromatic hydrocarbon group can be substituted with fluorine, hydroxy or alkoxy, and —$CH_2$— in the aliphatic hydrocarbon group and the aromatic hydrocarbon group may be replaced with —O— or —CO—, provided that $R^{id}$ is neither hydroxy nor alkoxy. Preferred $R^{id}$ is the same as the preferred $R^{Id}$ as described above.

The composition of the present invention can further comprise polymer different from the polysiloxane A. Preferably, it comprises an acrylic resin and/or a polysiloxane B containing no repeating unit of the formula (Ia). Hereinafter, the polysiloxane A, the acrylic resin, and the polysiloxane B are sometimes collectively referred to as the alkali-soluble resin.

Acrylic Resin

The acrylic resin used in the present invention can be selected from commonly used acrylic resin, such as polyacrylic acid, polymethacrylic acid, polyalkyl acrylate, polyalkyl methacrylate. An acrylic resin comprising at least one of a repeating unit containing an acryloyl group, a repeating unit containing a carboxyl group and a repeating unit containing an alkoxysilyl group is preferable, and an acrylic resin comprising a repeating unit containing an acryloyl group, a repeating unit containing a carboxyl group and a repeating unit containing an alkoxysilyl group is more preferable.

Although the repeating unit containing a carboxyl group is not particularly limited as long as it is a repeating unit containing a carboxyl group at its side chain, a repeating unit derived from an unsaturated carboxylic acid, an unsaturated carboxylic anhydride or a mixture thereof is preferable.

Although the repeating unit containing an alkoxysilyl group can be a repeating unit containing an alkoxysilyl group at its side chain, it is preferably a repeating unit derived from a monomer represented by the following formula (B):

$$X^B—(CH_2)_a—Si(OR^B)_b(CH_3)_{3-b} \quad \text{(B)}$$

wherein, $X^B$ is a vinyl group, a styryl group or a (meth)acryloyloxy group, and $R^B$ is a methyl group or an ethyl group, a is an integer of 0 to 3, and b is an integer of 1 to 3.

Further, it is preferable that the above-described polymer contains a repeating unit containing a hydroxyl group derived from a hydroxyl group-containing unsaturated monomer.

The mass average molecular weight of the acrylic resin according to the present invention is not particularly limited, and is preferably 1,000 to 40,000, more preferably 2,000 to 30,000. Here, the mass average molecular weight is a mass average molecular weight in terms of polystyrene according to gel permeation chromatography. In addition, as far as the number of acid groups is concerned, the solid content acid value is usually 40 to 190 mgKOH/g, more preferably 60 to 150 mgKOH/g, from the viewpoint of enabling development with a low-concentration alkaline developer and achieving both reactivity and storage stability.

Polysiloxane B

The polysiloxane B is polysiloxane containing no repeating unit represented by the above formula (Ia). It is preferable that the polysiloxane B contains the repeating unit represented by the above formula (Ib), and also preferable that it further contains the repeating unit represented by the formula (Ic). Furthermore, other repeating units can be contained.

The mass average molecular weight of polysiloxane B is not particularly limited. However, the higher the molecular weight is, the more the coating properties tend to be improved. On the other hand, the lower the molecular weight is, the less the synthesis conditions are limited and the easier the synthesis is, and it is difficult to synthesize polysiloxane having a very high molecular weight. For these reasons, the mass average molecular weight of polysiloxane is usually 1,500 to 20,000, and preferably 2,000 to 15,000 in view of the solubility in an organic solvent and the solubility in an alkali developer. Here, the mass average molecular weight is a mass average molecular weight in terms of polystyrene, which can be measured by gel permeation chromatography based on polystyrene.

The content of the polysiloxane A is preferably 20 to 100 mass %, more preferably 50 to 100 mass %, based on the total mass of all polymer contained in the composition.

Further, a cured film is formed through application of the composition containing the alkali-soluble resin used in the present invention onto a substrate, imagewise exposure, and development. At this time, it is necessary that a difference in solubility occurs between the exposed area and the unexposed area, and the coating film in the unexposed area should have a certain or more solubility in a developer. For example, it is considered that a pattern can be formed by exposure-development if dissolution rate of the coating film after pre-baked, in a 2.38% tetramethylammonium hydroxide (hereinafter sometimes referred to as TMAH) aqueous solution (hereinafter sometimes referred to as alkali dissolution rate or ADR, which is described later in detail) is 50 Å/sec or more. However, since the required solubility varies depending on the film thickness of the cured film to be formed and the development conditions, the alkali-soluble resin should be appropriately selected according to the development conditions. For example, if the film thickness is 0.1 to 100 μm (1,000 to 1,000,000 Å), the dissolution rate in a 2.38% TMAH aqueous solution is preferably 50 to 20,000 Å/sec, and more preferably 1,000 to 10,000 Å/sec.

For the alkali-soluble resin used in the present invention, alkali-soluble resin having any ADR within the above range can be selected depending on the application and required characteristics. A mixture having a desired ADR can be prepared by combining polysiloxane and the alkali-soluble resin having different ADR.

The alkali-soluble resin having different alkali dissolution rates and mass average molecular weights can be prepared by changing the catalyst, reaction temperature, reaction time or polymer. Using a combination of polysiloxane and the alkali-soluble resin having different alkali dissolution rates, it is possible to improve reduction of residual insolubles after development, reduction of pattern reflow, pattern stability, and the like.

Such alkali-soluble resin includes, for example, (M) polysiloxane whose film after pre-baked is soluble in a 2.38 mass % TMAH aqueous solution and has dissolution rate of 200 to 3,000 Å/sec.

Further, a composition having a desired dissolution rate can be obtained, if necessary, by mixing with:

(L) polysiloxane whose film after pre-baked is soluble in a 5 mass % TMAH aqueous solution and has dissolution rate of 1,000 Å/sec or less, or (H) polysiloxane whose film after pre-baked has dissolution rate in a 2.38 mass % TMAH aqueous solution of 4,000 Å/sec or more.

Measurement of Alkaline Dissolution Rate (ADR) and Calculation Method Thereof Using a TMAH aqueous solution as an alkaline solution, the alkali dissolution rate of the alkali-soluble resin is measured and calculated as described below.

The alkali-soluble resin is diluted with propylene glycol monomethyl ether acetate (PGMEA) so as to be 35 mass % and dissolved while stirring at room temperature with a stirrer for 1 hour. In a clean room under an atmosphere of temperature of 23.0±0.5° C. and humidity of 50±5.0%, using a pipette, 1 cc of the prepared alkali-soluble resin solution is dropped on the center area of a 4-inch silicon wafer having thickness of 525 μm and spin-coated to make the thickness 2 ±0.1 μm, and then the resultant film is heated on a hot plate at 100° C. for 90 seconds to remove the solvent. The film thickness of the coating film is measured with a spectroscopic ellipsometer (manufactured by J. A. Woollam).

Next, the silicon wafer having this film is gently immersed in a glass petri dish having a diameter of 6 inches, into which 100 ml of a TMAH aqueous solution adjusted to 23.0±0.1 ° C. and having a predetermined concentration was put, then allowed to stand, and the time until the coating film disappears is measured. The dissolution rate is determined by dividing by the time until the film in the area of 10 mm inside from the wafer edge disappears. In the case that the dissolution rate is remarkably slow, the wafer is immersed in a TMAH aqueous solution for a certain period and then heated for 5 minutes on a hot plate at 200° C. to remove moisture taken in the film during the dissolution rate measurement. Thereafter, film thickness is measured, and the dissolution rate is calculated by dividing the amount of change in film thickness before and after the immersion, by the immersion time. The above measurement method is performed 5 times, and the average of the obtained values is taken as the dissolution rate of the alkali-soluble resin.

(II) Polymerization Initiator

The composition according to the present invention comprises a polymerization initiator. The polymerization initiator includes a polymerization initiator that generates an acid, a base or a radical by radiation, and a polymerization initiator that generates an acid, a base or a radical by heat. In the present invention, the former is preferable and the photo radical generator is more preferable, in terms of process shortening and cost since the reaction is initiated immediately after the radiation irradiation and the reheating process performed after the radiation irradiation and before the development process can be omitted.

The photo radical generator can improve the resolution by strengthening the pattern shape or increasing the contrast of development. The photo radical generator used in the present invention is a photo radical generator that emits a radical when irradiated with radiation. Here, examples of the radiation include visible light, ultraviolet light, infrared light, X-ray, electron beam, α-ray, and γ-ray.

The addition amount of the photo radical generator is preferably 0.001 to 30 mass %, more preferably 0.01 to 10 mass %, based on the total mass of the alkali-soluble resin, though the optimal amount thereof depends on the type and amount of active substance generated by decomposition of the photo radical generator, the required photosensitivity, and the required dissolution contrast between the exposed area and unexposed area. If the addition amount is less than 0.001 mass %, the dissolution contrast between the exposed area and unexposed portion is too low, and the addition effect is not sometimes exhibited. On the other hand, when the addition amount of the photo radical generator is more than 30 mass %, colorless transparency of the coated film sometimes decreases, because it sometimes occurs that cracks are generated in the coated film and coloring due to decomposition of the photo radical generator becomes remarkable. Further, when the addition amount become large, thermal decomposition may cause deterioration of the electrical insulation of the cured product and release of gas, which sometimes becomes a problem in subsequent processes. Further, the resistance of the coated film to a photoresist stripper containing monoethanolamine or the like as a main component sometimes deteriorates.

Examples of the photo radical generator include azo-based, peroxide-based, acylphosphine oxide-based, alkylphenone-based, oxime ester-based, and titanocene-based initiators. Among them, alkylphenone-based, acylphosphine oxide-based and oxime ester-based initiators are preferred, and 2,2-dimethoxy-1,2-diphenylethan-1-one, 1-hydroxy-cyclohexylphenyl ketone, 2-hydroxy-2-methyl-1-phenylpropan-1-one, 1-[4-(2-hydroxyethoxy)phenyl]-2-hydroxy-2-methyl-1-propan-1-one, 2-hydroxy-1-{4-[4-(2-hydroxy-2-methylpropionyl)-benzyl]phenyl}-2-methylpropan-1-one, 2-methyl-1-(4-methylthiophenyl)-2-morpholinopropan-1-one, 2-benzyl-2-dimethylamino-1-(4-morpholinophenyl)-1-butanone, 2-(dimethylamino)-2-[(4-methylphenyl)methyl]-1-[4-(4-morpholinyl)-phenyl]-1-butanone, 2,4,6-trimethylbenzoyldiphenyl-phosphine oxide, bis (2,4,6-trimethylbenzoyl)-phenylphosphine oxide, 1,2-octanedione, 1-[4-(phenylthio)-, 2-(O-benzoyloxime)], ethanone, 1-[9-ethyl-6-(2-methylbenzoyl)-9H-carbazol-3-yl]-, 1-(O-acetyloxime), and the like are included.

(III) Compound Containing Two or More (Meth)Acryloyloxy Groups

The composition according to the present invention comprises a compound containing two or more (meth)acryloyloxy groups (hereinafter sometimes referred to as the (meth) acryloyloxy group-containing compound for simplicity). Here, the (meth)acryloyloxy group is a general term for the acryloyloxy group and the methacryloyloxy group. This compound is a compound that can form a crosslinked structure by reacting with an alkali-soluble resin or the like. Here, in order to form a crosslinked structure, a compound containing two or more acryloyloxy groups or methacryloyloxy groups, which are reactive groups, is needed, and in order to form a higher-order crosslinked structure, it preferably contains three or more acryloyloxy groups or methacryloyloxy groups.

As such a compound containing two or more (meth) acryloyloxy groups, esters obtained by reacting (α) a polyol compound having two or more hydroxyl groups with (β) two or more (meth)acrylic acids are preferably used. As the polyol compound (α), compounds having, as a basic skeleton, a saturated or unsaturated aliphatic hydrocarbon, aromatic hydrocarbon, heterocyclic hydrocarbon, primary, secondary or tertiary amine, ether or the like, and having, as substituents, two or more hydroxyl groups are included. The polyol compound can contain other substituent, for example, a carboxyl group, a carbonyl group, an amino group, an ether bond, a thiol group, a thioether bond, and the like, as long as the effects of the present invention are not impaired.

Preferred polyol compounds include alkyl polyols, aryl polyols, polyalkanolamines, cyanuric acid, and dipentaerythritol. Here, when the polyol compound (α) has three or more hydroxyl groups, it is not necessary that all the hydroxyl groups have reacted with (meth)acrylic acid, and they can be partially esterified. This means that the esters can have unreacted hydroxyl group(s). As such esters, tris(2-acryloxyethyl) isocyanurate, dipentaerythritol hexa(meth) acrylate, tripentaerythritol octa(meth) acrylate, pentaerythritol tetra(meth)acrylate, dipropylene glycol diacrylate, tripropylene glycol diacrylate, trimethylolpropane triacrylate, polytetramethylene glycol dimethacrylate, trimethylolpropane trimethacrylate, ditrimethylolpropane tetraacrylate, tricyclodecane dimethanol diacrylate, 1,9-nonanediol diacrylate, 1,6-hexanediol diacrylate, 1,10-decanediol diacrylate, and the like are included. Among them, tris(2-acryloxyethyl) isocyanurate and dipentaerythritol hexaacrylate are preferred from the viewpoint of reactivity and the number of crosslinkable groups. Further, in order to adjust the shape of the formed pattern, two or more of these compounds can be combined. Specifically, a compound containing three (meth)acryloyloxy groups and a compound containing two (meth)acryloyloxy groups can be combined.

Such a compound is preferably a molecule that is relatively smaller than the alkali-soluble resin from the viewpoint of reactivity. For this reason, the molecular weight thereof is preferably 2,000 or less, and more preferably 1,500 or less.

Although the content of the (meth)acryloyloxy group-containing compound is adjusted according to the type of the polymer or the (meth)acryloyloxy group-containing compound to be used, it is preferably 3 to 50 mass % based on the total mass of the alkali-soluble resin from the viewpoint of compatibility with resin. Further, from the viewpoint of suppressing film loss, the content is more preferably 20 to 50 mass %. Furthermore, the (meth)acryloyloxy group-containing compounds can be used alone or in combination of two or more.

(IV) Solvent

The composition according to the present invention comprises a solvent. This solvent is not particularly limited as long as it can uniformly dissolve or disperse the alkali-soluble resin, the polymerization initiator, the (meth)acryloyloxy group-containing compound, and the additives that are optionally added. Examples of the solvent that can be used in the present invention include ethylene glycol monoalkyl ethers, such as ethylene glycol monomethyl ether, ethylene glycol monoethyl ether, ethylene glycol monopropyl ether and ethylene glycol monobutyl ether; diethylene glycol dialkyl ethers, such as diethylene glycol dimethyl ether, diethylene glycol diethyl ether, diethylene glycol dipropyl ether and diethylene glycol dibutyl ether; ethylene glycol alkyl ether acetates, such as methyl cellosolve acetate and ethyl cellosolve acetate; propylene glycol monoalkyl ethers, such as propylene glycol monomethyl ether and propylene glycol monoethyl ether; propylene glycol alkyl ether acetates such as PGMEA, propylene glycol monoethyl ether acetate and propylene glycol monopropyl ether acetate; aromatic hydrocarbons, such as benzene, toluene and xylene; ketones, such as methyl ethyl ketone, acetone, methyl amyl ketone, methyl isobutyl ketone and cyclohexanone; alcohols, such as ethanol, propanol, butanol, hexanol, cyclohexanol, ethylene glycol and glycerin; esters, such as ethyl lactate, ethyl 3-ethoxypropionate, methyl 3-methoxypropionate; and cyclic esters, such as γ-butyrolactone, and the like. Among them, it is preferable to use propylene glycol alkyl ether acetates or esters together with alcohols having a linear or branched alkyl group having 4 or 5 carbon atoms from the viewpoints of availability easiness, handling easiness and solubility of the polymer. From the viewpoint of coating properties and storage stability, the solvent ratio of the alcohol is preferably 5 to 80%.

The solvent content of the composition according to the present invention can be freely adjusted according to the method for applying the composition, and the like. For example, when the composition is applied by spray coating, it is also possible to make the proportion of the solvent in the composition be 90 mass % or more. In the case of slit coating, which is used for coating a large substrate, the solvent content is usually 60 mass % or more, and preferably 70 mass % or more. The properties of the composition of the present invention does not vary largely with the amount of solvent.

Although the composition according to the present invention essentially includes the above-described (I) to (IV), further compounds can be optionally combined. The materials that can be combined are as described below. In addition, the content of the components other than (I) to (IV) in the entire composition is, preferably 50 mass % or less, more preferably 30 mass % or less when a coloring agent is added, and preferably 30 mass % or less, more preferably 20 mass % or less when no coloring agent is added, based on the total mass of the composition.

The composition according to the present invention can optionally comprise other additives. As such additives, a developer dissolution accelerator, a scum remover, an adhesion enhancer, a polymerization inhibitor, an antifoaming agent, a surfactant, and a sensitizer, and the like are included.

The developer dissolution accelerator or scum remover has a function of adjusting the solubility of the formed coated film in the developer and preventing scum from remaining on the substrate after development. As such an additive, crown ether can be used. The crown ether having the simplest structure is represented by the general formula $(-CH_2-CH_2-O-)_n$. Preferred in the present invention are those in which n is 4 to 7. When x is set to be the total number of atoms constituting the ring and y is set to be the number of oxygen atoms contained therein, the crown ether is sometimes called x-crown-y-ethers. In the present invention, preferred is selected from the group consisting of crown ethers, wherein x=12, 15, 18 or 21, and y=x/3, and their benzo condensates and cyclohexyl condensates. Specific examples of more preferred crown ethers include 21-crown-7-ether, 18-crown-6-ether, 15-crown-5-ether, 12-crown-4-ether, dibenzo-21-crown-7-ether, dibenzo-18-crown-6-ether, dibenzo-15-crown-5-ether, dibenzo-12-crown-4-ether, dicyclohexyl-21-crown-7-ether, dicyclo-hexyl-18-crown-6-ether, dicyclo-hexyl-15-crown-5-ether, and dicyclohexyl-12-crown-4-ether. In the present invention, among them, most preferred is selected from 18-crown-6-ether and 15-crown-5-ether. The content thereof is preferably 0.05 to 15 mass %, more preferably 0.1 to 10 mass %, based on the total mass of the alkali-soluble resin.

The adhesion enhancer has an effect of preventing a pattern from peeling off due to stress applied after baking when a cured film is formed using the composition according to the present invention. As the adhesion enhancer, imidazoles, silane coupling agents, and the like are preferred. Among imidazoles, 2-hydroxybenzimidazole, 2-hydroxyethylbenzimidazole, benzimidazole, 2-hydroxyimidazole, imidazole, 2-mercaptoimidazole and 2-aminoimidazole are preferable, and 2-hydroxybenzimidazole, benzimidazole, 2-hydroxyimidazole and imidazole are particularly preferably used.

As the silane coupling agent, known ones are suitably used, and examples thereof include epoxy silane coupling agents, amino silane coupling agents, mercapto silane coupling agents, and the like. Specifically, 3-glycidoxypropyltrimethoxysilane, 3-glycidoxypropyltriethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-ureidopropyltriethoxysilane, 3-chloropropyltriethoxysilane, 3-mercaptopropyltrimethoxysilane, 3-methacryloxypropyltrimethoxysilane, 3-methacryloxypropyltriethoxysilane, 3-methacryloxypropylmethyldimethoxysilane, 3-methacryloxypropylmethyldiethoxysilane, 3-isocyanatopropyltriethoxysilane, tris (trimethoxysilylpropyl) isocyanurate, and the like are preferred. These can be used alone or in combination of two or more, and the addition amount thereof is preferably 0.05 to 15 mass % based on the total mass of the alkali-soluble resin.

Further, as the silane coupling agent, a silane compound and siloxane compound having an acid group, or the like can be used. Examples of the acid group include a carboxyl group, an acid anhydride group, and a phenolic hydroxyl group. When it contains a monobasic acid group such as a carboxyl group or a phenolic hydroxyl group, it is preferred that a single silicon-containing compound has a plurality of acid groups.

Exemplified embodiments of such a silane coupling agent include a compound represented by the formula (C):

$$X_nSi(OR^3)_{4-n} \qquad (C)$$

or polymer obtained using it as a repeating unit. At this time, a plurality of repeating units having different X or $R^3$ can be used in combination.

In the formula, $R^3$ includes a hydrocarbon group, for example, an alkyl group such as a methyl group, an ethyl group, an n-propyl group, an isopropyl group, and an n-butyl group. In the general formula (C), a plurality of $R^3$ are included, and each $R^3$ can be identical or different.

As X, those having an acid group such as phosphonium, borate, carboxyl, phenol, peroxide, nitro, cyano, sulfo, and alcohol group are included, and those in which these acid groups are protected by acetyl, aryl, amyl, benzyl, methoxymethyl, mesyl, tolyl, trimethoxysilyl, triethoxysilyl, triisopropylsilyl or trityl group, and an acid anhydride group are included.

Among them, a compound having a methyl group as $R^3$ and a carboxylic acid anhydride group as X, such as an acid anhydride group-containing silicone, is preferable.

More specifically, a compound represented by the following formula (X-12-967C (trade name, Shin-Etsu Chemical Co., Ltd.)) or polymer containing a structure corresponding thereto in its terminal or side chain of a silicon-containing polymer such as silicone is preferred.

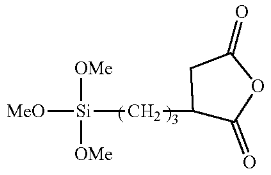 [SMILES: CO[Si](CC1CC(=O)OC1=O)(OC)OC]

Further, a compound in which an acid group such as thiol, phosphonium, borate, carboxyl, phenol, peroxide, nitro, cyano, and sulfo group is provided at the terminal of dimethyl silicone is also preferable. As such a compound, compounds represented by the following formulae (X-22-2290AS and X-22-1821 (trade name in every case, Shin-Etsu Chemical Co., Ltd.)) are included.

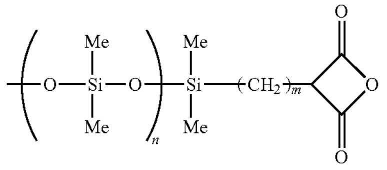

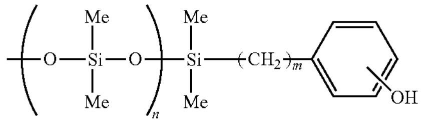

When the silane coupling agent has a silicone structure, if the molecular weight is too large, the compatibility with polysiloxane contained in the composition becomes poor, so that there is a possibility that there is an adverse effect such that the solubility in the developer does not improve, the reactive group remains in the film, and the chemical resistance that can withstand the subsequent process cannot be maintained. For this reason, the mass average molecular weight of the silane coupling agent is preferably 5,000 or less, and more preferably 4,000 or less.

As the polymerization inhibitor, an ultraviolet absorber as well as nitrone, nitroxide radical, hydroquinone, catechol, phenothiazine, phenoxazine, hindered amine and derivatives thereof can be added. Among them, methylhydroquinone, catechol, 4-t-butylcatechol, 3-methoxycatechol, phenothiazine, chlorpromazine, phenoxazine, TINUVIN 144, 292 and 5100 (BASF) as the hindered amine, and TINUVIN 326, 328, 384-2, 400 and 477 (BASF) as the ultraviolet absorber are preferred. These can be used alone or in combination of two or more, and the content thereof is preferably 0.01 to 20 mass % based on the total mass of the alkali-soluble resin.

As the antifoaming agent, alcohols ($C_{1-18}$), higher fatty acids such as oleic acid and stearic acid, higher fatty acid esters such as glycerin monolaurate, polyethers such as polyethylene glycols (PEG) (Mn: 200 to 10,000) and polypropylene glycols (PPG) (Mn: 200 to 10,000), silicone compounds such as dimethyl silicone oil, alkyl-modified silicone oil and fluorosilicone oil, and organosiloxane-based surfactants described in detail below are included. These can be used alone or in combination of a plurality of these, and the content thereof is preferably 0.1 to 3 mass % based on the total mass of the alkali-soluble resin.

Further, the composition according to the present invention can optionally comprise a surfactant. The surfactant is added for the purpose of improving coating properties, developability, and the like. Examples of the surfactant that can be used in the present invention include nonionic surfactants, anionic surfactants, and amphoteric surfactants.

Examples of the nonionic surfactant include, polyoxyethylene alkyl ethers, such as polyoxyethylene lauryl ether, polyoxyethylene oleyl ether and polyoxyethylene cetyl ether; polyoxyethylene fatty acid diester; polyoxyethylene fatty acid monoester; polyoxyethylene polyoxypropylene block polymer; acetylene alcohol; acetylene glycol; polyethoxylate of acetylene alcohol; acetylene glycol derivatives, such as polyethoxylate of acetylene glycol; fluorine-containing surfactants, such as Fluorad (trade name, 3M Japan Limited), Megafac (trade name, DIC Corporation), Surflon (trade name, AGC Inc.); or organosiloxane surfactants, such as KP341 (trade name, Shin-Etsu Chemical Co., Ltd.). Examples of the above-described acetylene glycol include 3-methyl-1-butyne-3-ol, 3-methyl-1-pentyn-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, 2,5-di-methyl-2,5-hexanediol, and the like.

Further, examples of the anionic surfactant include ammonium salt or organic amine salt of alkyl diphenyl ether disulfonic acid, ammonium salt or organic amine salt of alkyl diphenyl ether sulfonic acid, ammonium salt or organic amine salt of alkyl benzene sulfonic acid, ammonium salt or organic amine salt of polyoxyethylene alkyl ether sulfuric acid, ammonium salt or organic amine salt of alkyl sulfuric acid, and the like.

Further, examples of the amphoteric surfactant include 2-alkyl-N-carboxymethyl-N-hydroxyethyl imidazolium betaine, lauric acid amide propyl hydroxysulfone betaine, and the like.

These surfactants can be used alone or as a mixture of two or more types, and the content thereof is preferably 0.005 to 1 mass %, more preferably 0.01 to 0.5 mass %, based on the total mass of the composition.

A sensitizer can be optionally added to the composition according to the present invention. The sensitizer preferably used in the composition according to the present invention includes coumarin, ketocoumarin and their derivatives, thiopyrylium salts, acetophenones, and the like, and specifically, p-bis(o-methylstyryl) benzene, 7-dimethylamino-4-methylquinolone-2,7-amino-4-methylcoumarin, 4,6-di-methyl-7-ethylaminocoumarin, 2-(p-dimethylamino-styryl)-pyridylmethyl-iodide, 7-diethylaminocoumarin, 7-diethylamino-4-methyl-coumarin, 2,3,5,6-1H,4H-tetrahydro-8-methyl-quinolizino-<9,9a,1-gh>coumarin, 7-diethylamino-4-trifluoromethylcoumarin, 7-dimethylamino-4-trifluoromethylcoumarin, 7-amino-4-trifluoromethylcoumarin, 2,3,5,6-1H,4H-tetrahydroquinolizino-<9,9a,1-gh>coumarin, 7-ethylamino-6-methyl-4-trifluoromethylcoumarin, 7-ethylamino-4-trifluoromethylcoumarin, 2,3,5,6-1H,4H-tetrahydro-9-carbo-ethoxyquinolizino-<9,9a,1-gh>coumarin, 3-(2'-N-methylbenzimidazolyl)-7-N,N-diethylaminocoumarin, N-methyl-4-trifluoro-methylpiperidino-<3,2-g>coumarin, 2-(p-dimethylaminostyryl)-benzothiazolylethyl iodide, 3-(2'-benzimidazolyl)-7-N,N-diethylaminocoumarin, 3-(2'-benzothiazolyl)-7-N,N-diethylaminocoumarin, and sensitizing dyes such as pyrylium salts and thiopyrylium salts represented by the following chemical formula. By the addition of the sensitizing dye, patterning using an inexpensive light source such as a high-pressure mercury lamp (360 to 430 nm) becomes possible. The content thereof is preferably 0.05 to 15 mass %, more preferably 0.1 to 10 mass %, based on the total mass of the alkali-soluble resin.

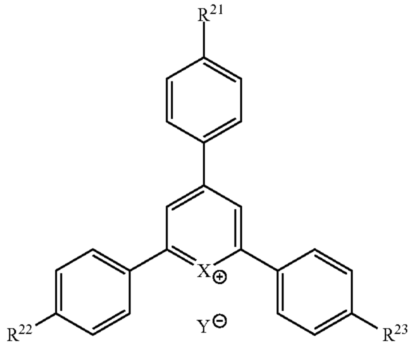

| X | $R^{21}$ | $R^{22}$ | $R^{23}$ | Y |
|---|---|---|---|---|
| S | $OC_4H_9$ | H | H | $BF_4$ |
| S | $OC_4H_9$ | $OCH_3$ | $OCH_3$ | $BF_4$ |
| S | H | $OCH_3$ | $OCH_3$ | $BF_4$ |
| S | $N(CH_3)_2$ | H | H | $ClO_2$ |
| O | $OC_4H_9$ | H | H | $SbF_6$ |

Further, as the sensitizer, an anthracene skeleton-containing compound can be used. Specifically, a compound represented by the following formula is included.

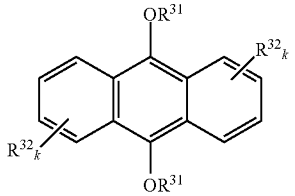

wherein, $R^{31}$ each independently represents a substituent selected from the group consisting of an alkyl group, an aralkyl group, an allyl group, a hydroxyalkyl group, an alkoxyalkyl group, a glycidyl group, and a halogenated alkyl group, $R^{32}$ each independently represents a substituent selected from the group consisting of a hydrogen atom, an alkyl group, an alkoxy group, a halogen atom, a nitro group, a sulfonic acid group, a hydroxyl group, an amino group, and a carboalkoxy group, and k is each independently an integer selected from 0 and 1 to 4.

When such a sensitizer having an anthracene skeleton is used, its content is preferably 0.01 to 5 mass % based on the total mass of the alkali-soluble resin.

Further, a curing agent can be optionally added to the composition according to the present invention. The curing agent can improve the resolution by strengthening the pattern shape or increasing the contrast of development. Examples of the curing agent used in the present invention include a photoacid generator and a photobase generator, which are decomposed upon irradiation with radiation to release respectively an acid and a base being active substances, which photo-cure the composition. Here, examples of the radiation include visible light, ultraviolet light, infrared light, X-ray, electron beam, α-ray, γ-ray, and the like.

The content of the curing agent is preferably 0.001 to 10 mass %, more preferably 0.01 to 5 mass %, based on the total mass of the alkali-soluble resin, though the optimal amount thereof depends on the type and amount of active substance generated by decomposition of the curing agent, the required photosensitivity, and the required dissolution contrast between the exposed area and unexposed area.

Method for Forming Cured Film

The method for forming a cured film according to the present invention comprises applying the above-described composition onto a substrate to form a coating film, exposing the coating film, and developing the coating film. The method for forming a cured film is described in process order as follows.

(1) Application Process

First, the above-described composition is applied onto a substrate. Formation of the coating film of the composition in the present invention can be carried out by any method conventionally known as a method for applying a photosensitive composition. Specifically, it can be freely selected from dip coating, roll coating, bar coating, brush coating, spray coating, doctor coating, flow coating, spin coating, slit coating, and the like. Further, as the substrate on which the composition is applied, a suitable substrate such as a silicon substrate, a glass substrate, a resin film, and the like can be used. Various semiconductor devices and the like can be formed on these substrates as needed. When the substrate is a film, gravure coating can also be utilized. If desired, a drying process can be additionally provided after applying the film. Further, if necessary, the applying process can be repeated once or twice or more to make the film thickness of the coating film to be formed as desired.

(2) Pre-Baking Process

After forming the coating film of the composition by applying the composition, it is preferable to carry out pre-baking (heat treatment) of the coating film in order to dry the coating film and reduce the residual amount of the solvent in the coating film. The pre-baking process can be carried out at a temperature of generally 70 to 150° C., preferably 90 to 120° C., in the case of a hot plate, for 10 to 300 seconds, preferably 30 to 120 seconds and in the case of a clean oven, for 1 to 30 minutes.

(3) Exposure Process

After forming a coating film, the coating film surface is then irradiated with light. As the light source to be used for the light irradiation, any one conventionally used for a pattern forming method can be used. As such a light source, a high-pressure mercury lamp, a low-pressure mercury lamp, a lamp such as metal halide and xenon, a laser diode, an LED and the like can be included. As the irradiation light, ultraviolet ray such as g-line, K-line and i-line is usually used. Except ultrafine processing for semiconductors or the like, it is general to use light of 360 to 430 nm (high-pressure mercury lamp) for patterning of several μm to several dozen μm. Above all, in the case of liquid crystal display devices, light of 430 nm is often used. In such a case, as described above, it is advantageous to combine a sensitizing dye with the composition according to the present invention. The energy of the irradiation light is generally 5 to 2,000 $mJ/cm^2$, preferably 10 to 1,000 $mJ/cm^2$, although it depends on the light source and the film thickness of the coating film. If the irradiation light energy is lower than 5 $mJ/cm^2$, sufficient resolution cannot be obtained in some cases. On the other hand, when the irradiation light energy is higher than 2,000 $mJ/cm^2$, the exposure becomes excess and occurrence of halation is sometimes brought.

In order to irradiate light in a pattern shape, a general photomask can be used. Such a photomask can be freely selected from well-known ones. The environment at the time of irradiation is not particularly limited and can generally be set as an ambient atmosphere (in the air) or nitrogen atmosphere. Further, in the case of forming a film on the entire surface of the substrate, light irradiation can be performed over the entire surface of the substrate. In the present invention, the pattern film also includes such a case where a film is formed on the entire surface of the substrate.

(4) Post Exposure Baking Process

After the exposure, to promote the reaction between the polymer in the film by the polymerization initiator, post exposure baking can be performed as necessary. Different from the heating process (6) to be described later, this heating treatment is performed not to completely cure the coating film but to leave only a desired pattern on the substrate after development and to make other areas capable of being removed by development. Therefore, it is not essential in the present invention.

When the post exposure baking is performed, a hot plate, an oven, a furnace, and the like can be used. The heating temperature should not be excessively high because it is not desirable for the acid, base or radical in the exposed area, which is generated by light irradiation, to diffuse to the unexposed area. From such a viewpoint, the range of the heating temperature after exposure is preferably 40 to 150° C., and more preferably 60 to 120° C. Stepwise heating can be applied as needed to control the curing rate of the composition. Further, the atmosphere during the heating is not particularly limited and can be selected from in an inert gas such as nitrogen, under a vacuum, under a reduced pressure, in an oxygen gas, and the like, for the purpose of controlling the curing rate of the composition. Further, the heating time is preferably above a certain level in order to maintain higher the uniformity of temperature history in the wafer surface and is preferably not excessively long in order to suppress diffusion of the generated acid, base or radical. From such a viewpoint, the heating time is preferably 20 seconds to 500 seconds, and more preferably 40 seconds to 300 seconds.

(5) Developing Process

After post-exposure heating is optionally performed after exposure, the coating film is developed. As the developer to be used at the time of development, any developer conventionally used for developing a photosensitive composition can be used. In the present invention, a TMAH aqueous solution is used to specify the dissolution rate of alkali-soluble resin, but the developer used for forming the cured film is not limited to this. Preferable examples of the developer include an alkali developer which is an aqueous solution of an alkaline compound such as tetraalkylammonium hydroxide, choline, alkali metal hydroxide, alkali metal metasilicate (hydrate), alkali metal phosphate (hydrate), ammonia, alkylamine, alkanolamine and heterocyclic amine, and a particularly preferable alkali developer is a TMAH aqueous solution, a potassium hydroxide aqueous solution, or a sodium hydroxide aqueous solution. In this alkali developer, a water-soluble organic solvent such as methanol and ethanol, or a surfactant can be further contained, if necessary. The developing method can also be freely selected from conventionally known methods. Specifically, methods such as dipping in a developer (dip), paddle, shower, slit, cap coat, spray, and the like can be included. After the development with a developer, by which a pattern can be obtained, it is preferable that rinsing with water is carried out.

(6) Heating Process

After development, the obtained pattern film is cured by heating. As the heating apparatus used for the heating process, the same one as used for the above-described post-exposure heating can be used. The heating temperature in the heating process is not particularly limited as long as it is a temperature at which curing of the coating film can be performed and can be freely determined. However, if the silanol group remains, the chemical resistance of the cured film sometimes becomes insufficient, or dielectric constant of the cured film sometimes becomes higher. From such a viewpoint, a relatively high temperature is generally selected as the heating temperature. In order to keep the remaining film ratio after curing high, the curing temperature is more preferably 350° C. or lower, and particularly preferably 250° C. or lower. On the other hand, in order to accelerate the curing reaction and obtain a sufficiently cured film, the curing temperature is preferably 70° C. or higher, more preferably 80° C. or higher, and particularly preferably 90° C. or higher. However, the composition according to the present invention retains sufficient chemical resistance even when cured at a low temperature of 70 to 130° C., particularly 100° C. or lower. Further, the heating time is not particularly limited and is generally 10 minutes to 24 hours, and preferably 30 minutes to 3 hours. In addition, this heating time is a time from when the temperature of the pattern film reaches a desired heating temperature. Usually, it takes about several minutes to several hours for the pattern film to reach a desired temperature from the temperature before heating.

The cured film thus obtained can achieve excellent transparency, chemical resistance, environmental resistance, and the like. For example, a film cured at 100° C. can achieve a light transmittance of 95% or more and also the relative dielectric constant of 4 or less. Thereafter, the relative dielectric constant is maintained even after 1,000 hours under the conditions of 65° C. and 90% humidity. For this reason, it has light transmittance, relative dielectric constant, chemical resistance, and environmental resistance, which are not available with the conventionally used acrylic material, and therefore it can be suitably utilized in many fields as a planarization film for the above-described various devices such as a flat panel display (FPD), an interlayer insulating film for low temperature polysilicon or a buffer coat film for IC chip, a transparent protective film, and the like.

The present invention is explained more specifically below with reference to Examples and Comparative Examples, but the present invention is not limited by these Examples and Comparative Examples at all.

Gel permeation chromatography (GPC) was measured using two columns of HLC-8220 GPC type high-speed GPC system (trade name, manufactured by Tosoh Corporation) and Super Multipore HZ-N type GPC column (trade name, manufactured by Tosoh Corporation). The measurement was performed using monodisperse polystyrene as a standard sample and tetrahydrofuran as an eluent, under the analytical conditions of a flow rate of 0.6 ml/min and a column temperature of 40° C.

Synthesis Example 1

Synthesis of Polysiloxane A: PSA-1:Me:Ph:KBM-9659:H=50:40:9.5:5

In a 3 L flask equipped with a stirrer, a thermometer and a condenser, a mixed solution of 204 g of methyltrimethoxysilane, 237 g of phenyl-trimethoxysilane, 185 g of KBM-9695 (Shin-Etsu Silicone), 1,200 g of PGMEA, and 1.8 g of trimethoxyhydrosilane was prepared. 6.6 g of 35% HCl aqueous solution was added to the mixed solution, followed by stirring at 25° C. for 3 hours. 400 ml of toluene and 600 ml of water were added to the neutralized solution to separate into two layers, and the aqueous layer was removed. Further, the resulting product was rinsed three times with 300 ml of water, the obtained organic layer was concentrated under reduced pressure to remove the solvent, and PGMEA was added to the concentrate to adjust the solid content concentration to be 35 mass %, thereby obtaining a polysiloxane PSA-1 solution. Mw of the obtained polysiloxane PSA-1 was 12,000.

Synthesis Example 2

Synthesis of Polysiloxane A: PSA-2

A polysiloxane PSA-2 solution was obtained in the same manner as in Synthesis Example 1 except being changed to Me:Ph:KBM-9659 H=50:20:19.5:5. Mw of the obtained polysiloxane PSA-2 was 16,400.

Synthesis Example 3

Synthesis of Polysiloxane A: PSA-3

A polysiloxane PSA-3 solution was obtained in the same manner as in Synthesis Example 1 except being changed to Me:Ph:KBM-9659:H=50:45:4.5:5. Mw of the obtained polysiloxane PSA-3 was 8,200.

Synthesis Example 4

Synthesis of Polysiloxane B: PSB-1

In a 2 L flask equipped with a stirrer, a thermometer and a condenser, 49.0 g of a 25 mass % TMAH aqueous solution, 600 ml of isopropyl alcohol (IPA), and 4.0 g of water were charged, and then in a dropping funnel, a mixed solution of 68.0 g of methyltrimethoxysilane, 79.2 g of phenyltrimethoxy-silane, and 15.2 g of tetramethoxysilane was prepared. The mixed solution was added dropwise at 40° C., stirred at the same temperature for 2 hours, and neutralized by adding a 10 mass % aqueous solution of HCl. 400 ml of toluene and 600 ml of water were added to the neutralized solution to separate into two layers, and the aqueous layer was removed. Further, the resulting product was rinsed three times with 300 ml of water, the obtained organic layer was concentrated under reduced pressure to remove the solvent, and PGMEA was added to the concentrate to adjust the solid content concentration to be 35 mass %, thereby obtaining a polysiloxane PSB-1 solution. Mw of the obtained polysiloxane PSB-1 was 1,700.

Synthesis Example 5

Synthesis of Acrylic Resin: AC-1

In a 2 L flask equipped with a stirrer, a thermometer, a condenser and a nitrogen gas introducing pipe, normal butanol and PGMEA solvent were charged, and under a nitrogen gas atmosphere, the temperature was raised to an appropriate temperature, while referring to the 10-hour half-life temperature of the initiator. Separately from that, a mixture liquid of acrylic acid, γ-methacryloxypropyltrimethoxysilane, 2-hydroxyethyl methacrylate and methyl methacrylate at 10:20:20:50, azobisisobutyronitrile (AIBN), and PGMEA was prepared, and the mixture liquid was dropped into the above-described solvent over 4 hours. Thereafter, the resulting product was reacted for 3 hours to obtain an acrylic resin AC-1. Mw of the obtained acrylic resin AC-1 was 8,700.

Synthesis Example 6

Synthesis of Acrylic Resin: AC-2

In a 2 L separable flask equipped with a stirrer, a thermometer, a reflux condenser, a dropping funnel and a nitrogen introducing pipe, 500 g of PGMEA was added. After raising the temperature to 95° C., 160 g of methacrylic acid, 100 g of methyl methacrylate, 16.6 g of t-butyl peroxy-2-ethylhexanoate (Perbutyl O; NOF Corporation) were added dropwise over 3 hours. After the dropwise addition, the mixture was stirred at room temperature for 4 hours to synthesize a polymer solution. To this polymer solution, 160 g of 3,4-epoxycyclohexylmethyl acrylate, 1.5 g of triphenylphosphine and 1.0 g of methylhydroquinone were added, and the mixture was reacted at 110° C. for 6 hours under a nitrogen atmosphere. After completion of the reaction, the resulting product was diluted with PGMEA so that the solid content became 35 mass %, thereby obtaining an acrylic resin having Mw of 11,000.

Synthesis Example 7

Synthesis of Other Polymer: P-1

To a 2 L four-necked flask, 235 g (epoxy equivalent: 235) of bisphenol fluorene type epoxy resin, 110 mg of tetramethylammonium chloride, 100 mg of 2,6-di-tert-butyl-4-methylphenol and 72.0 g of acrylic acid were added, and the mixture was heated at 120° C. for 12 hours to dissolve. Next, a mixture of a bisphenol fluorene type epoxy acrylate obtained by gradually raising the temperature while the solution was cloudy and heating to 120° C. to completely dissolve, acrylic acid, 2-hydroxyethyl methacrylate and methyl methacrylate at 10:20:20:50; azobisisobutyronitrile (AIBN); and PGMEA was prepared, and the mixture was dropped into the above-described solvent over 4 hours. Thereafter, the reaction was carried out for 3 hours to obtain a polymer P-1. Mw of the obtained polymer P-1 was 16,100.

Example 1

In a solution containing 100 parts by mass of the polysiloxane PSA-1 obtained in Synthesis Example 1, 3.5 parts by mass of "Irgacure OXE-02" from BASF as a polymerization initiator, 16 parts by mass of dipentane erythritol hexaacrylate ("A-DPH", Shin-Nakamura Chemical Co., Ltd.) as a (meth)acryloyloxy group-containing compound, 8.5 parts by mass of ε-caprolactone-modified tris-(2-acryloxyethyl) isocyanurate ("A-9300-1CL", Shin-Nakamura Chemical Co., Ltd.), and 0.01 parts by mass of "AKS-10" (Shin-Etsu Chemical Co., Ltd.) as a surfactant were added, and PGMEA was further added to prepare a 35% solution.

Examples 2 to 19

Comparative Examples 1 to 8

Compositions were prepared in which each constitution was changed from Example 1 as shown in Tables 1 and 2. The numerical values in the table indicate parts by mass.

TABLE 1

| | | | Example | | | | | | | | | | |
|---|---|---|---|---|---|---|---|---|---|---|---|---|---|
| | | | 1 | 2 | 3 | 4 | 5 | 6 | 7 | 8 | 9 | 10 | 11 |
| Composition | Polysiloxane A | PSA-1 | 100 | 100 | 100 | 100 | 70 | 60 | 50 | | | 20 | 100 |
| | | PSA-2 | | | | | | | | 60 | | | |
| | | PSA-3 | | | | | | | | | 60 | | |
| | PolysiloxaneB | PSB-1 | | | | | 30 | 40 | 50 | 40 | 40 | | |
| | Acrylic resin | AC-1 | | | | | | | | | | 25 | |
| | | AC-2 | | | | | | | | | | 30 | |
| | Other polymer | P-1 | | | | | | | | | | 25 | |
| | Polymerization initiator A | | 3.5 | 3.5 | 3.5 | 3.5 | 3.5 | 3.5 | 3.5 | 3.5 | 3.5 | 3.5 | 5 |
| | (meth)acryloyl oxy group-containing compound | AM-1 | 15 | | 20 | 25 | 15 | 15 | 15 | 15 | 15 | 15 | 40 |
| | | AM-2 | 8.5 | 25 | 5 | | 8.5 | 8.5 | 8.5 | 8.5 | 8.5 | 10 | |
| | | AM-3 | | | | | | | | | | | |
| | | AM-4 | | | | | | | | | | | |
| | | AM-5 | | | | | | | | | | | |
| | | AM-6 | | | | | | | | | | | |
| | Silane coupling agent A | | | | | | | | | | | | |
| | Silane coupling agent B | | | | | | | | | | | | |

TABLE 1-continued

| | | | | | | | | | | | | | |
|---|---|---|---|---|---|---|---|---|---|---|---|---|---|
| | Surfactant A | | 0.01 | 0.01 | 0.01 | 0.01 | 0.01 | 0.01 | 0.01 | 0.01 | 0.01 | 0.01 | 0.01 |
| Evaluation | Chemical resistance | heated at 120° C. after development | A | A | A | A | A | A | B | A | A | B | A |
| | | heated at 100° C. after development | A | A | A | A | A | A | B | A | A | B | A |

| | | | Example | | | | | | | |
|---|---|---|---|---|---|---|---|---|---|---|
| | | | 12 | 13 | 14 | 15 | 16 | 17 | 18 | 19 |
| Composition | Polysiloxane A | PSA-1 | 100 | 100 | 100 | 100 | 100 | 100 | 100 | 100 |
| | | PSA-2 | | | | | | | | |
| | | PSA-3 | | | | | | | | |
| | PolysiloxaneB | PSB-1 | | | | | | | | |
| | Acrylic resin | AC-1 | | | | | | | | |
| | | AC-2 | | | | | | | | |
| | Other polymer | P-1 | | | | | | | | |
| | Polymerization initiator A | | 3.5 | 3.5 | 3.5 | 3.5 | 3.5 | 3.5 | 3.5 | 3.5 |
| | (meth)acryloyl oxy group-containing compound | AM-1 | | | | | | 10 | 10 | 10 |
| | | AM-2 | 40 | | | | | 27 | 27 | 27 |
| | | AM-3 | | 40 | | | | | | |
| | | AM-4 | | | 40 | | | | | |
| | | AM-5 | | | | 40 | | | | |
| | | AM-6 | | | | | 40 | | | |
| | Silane coupling agent A | | | | | | | | 5 | |
| | Silane coupling agent B | | | | | | | | | 5 |
| | Surfactant A | | 0.01 | 0.01 | 0.01 | 0.01 | 0.01 | 0.01 | 0.01 | 0.01 |
| Evaluation | Chemical resistance | heated at 120° C. after development | A | A | A | A | A | A | A | A |
| | | heated at 100° C. after development | A | A | A | A | A | A | A | A |

TABLE 2

| | | | Comparative Example | | | | | | |
|---|---|---|---|---|---|---|---|---|---|
| | | | 1 | 2 | 3 | 4 | 5 | 6 | 7 |
| Composition | Polysiloxane A | PS A-1 | | | | | | | |
| | | PS A-2 | | | | | | | |
| | | PS A-3 | | | | | | | |
| | PolysiloxaneB | PSB-1 | 20 | 20 | 20 | | | | 100 |
| | Acrylic resin | AC-1 | 25 | 25 | 25 | | | 100 | |
| | | AC-2 | 30 | 30 | 30 | 100 | | | |
| | Other polymer | P-1 | 25 | 25 | 25 | | 100 | | |
| | Polymerization initiator A | | 3.5 | 3.5 | 3.5 | 3.5 | 3.5 | 3.5 | 3.5 |
| | (meth)acryloyl oxy group-containing compound | AM-1 | 15 | 15 | 15 | 15 | 15 | 15 | 15 |
| | | AM-2 | 10 | 8.5 | 8.5 | 8.5 | 8.5 | 8.5 | 8.5 |
| | | AM-3 | | | | | | | |
| | | AM-4 | | | | | | | |
| | | AM-5 | | | | | | | |
| | | AM-6 | | | | | | | |
| | Surfactant A | | 0.01 | 0.01 | 0.01 | 0.01 | 0.01 | 0.01 | 0.01 |
| Evaluation | Chemical resistance | heated at 120° C. after development | C | C | C | C | C | C | C |
| | | heated at 100° C. after development | C | C | C | C | C | C | C |

In the table:

Polymerization initiator A: "Irgacure OXE-02" (BASF)

AM-1: dipentaerythritol hexaacrylate ("A-DPH", Shin-Nakamura Chemical Co., Ltd.)

AM-2: ε-caprolactone-modified tris-(2-acryloxy-ethyl) isocyanurate ("A-9300-1CL", Shin-Nakamura Chemical Co., Ltd.)

AM-3: polyethylene glycol #200 diacrylate ("A-200", Shin-Nakamura Chemical Co., Ltd.)

AM-4: polyethylene glycol #1000 diacrylate ("A-1000", Shin-Nakamura Chemical Co., Ltd.)

AM-5: tricyclodecane dimethanol diacrylate ("A-DCP", Shin-Nakamura Chemical Co., Ltd.)

AM-6: 2,2-bis(4-(acryloxydiethoxy)phenyl) propane (EO: 4 mol) ("A-BPE-4", Shin-Nakamura Chemical Co., Ltd.)

Silane coupling agent A: tris-(trimethoxy-silylpropyl) isocyanurate

Silane coupling agent B: 3-methacryloxypropyltrimethoxysilane

Surfactant A: "AKS-10", Shin-Etsu Chemical Co., Ltd.

Each of the obtained compositions was applied onto an ITO or silicon wafer by spin coating, and after the application, the composition was prebaked on a hot plate at 100° C. for 90 seconds. At this time, the average film thickness was 2 to 3 μm. Exposure was performed using an i-line exposure machine, development was performed using a 2.38% TMAH aqueous solution, and rinsing with pure water was performed for 30 seconds. After rinsing, it was heated at 100° C. or 120° C. for one hour. Then, it was immersed in a stripper TOK106 (Tokyo Ohka Kogyo Co., Ltd.) for 3 minutes, and the change in the pattern shape after immersion was measured.

A: The amount of film loss before and after immersion was within ±10%.

B: The amount of film loss before and after immersion was more than 10% and within ±20%.

C: The amount of film loss exceeds 20%, or pattern peeling was confirmed.

The invention claimed is:

1. A negative type photosensitive composition comprising:

(I) a polysiloxane A comprising a repeating unit represented by the formula (Ia):

(Ia)

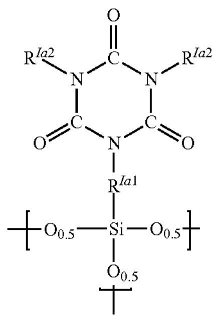

wherein, $R^{Ia1}$ is an alkylene group having 1 to 5 carbon atoms, wherein $—CH_2—$ in the alkylene group may be replaced with —O—, $R^{Ia2}$ is each independently hydrogen, an alkyl group having 1 to 5 carbon atoms, or an alkylene group having 1 to 5 carbon atoms, wherein $—CH_2—$ in the alkyl group and the alkylene group may be replaced with —O—, and when $R^{Ia2}$ is alkylene, a bond not bonded to nitrogen is bonded to Si contained in another repeating unit represented by the formula (Ia), (II) a polymerization initiator, (III) a a compound containing two or more (meth)acryloyloxy groups selected from the group consisting of tris(2-acryloxyethyl) isocyanurate, dipentaerythritol hexa(meth)acrylate, tripentaerythritol octa(meth) acrylate, pentaerythritol tetra(meth)acrylate, dipropylene glycol diacrylate, tripropylene glycol diacrylate, trimethylolpropane triacrylate, polytetramethylene glycol dimethacrylate, trimethylolpropane trimethacrylate, ditrimethylolpropane tetraacrylate, tricyclodecane dimethanol diacrylate, 1,9-nonanediol diacrylate, 1,6-hexanediol diacrylate and 1,10-decanediol diacrylate, and (IV) a solvent.

2. The composition according to claim 1, wherein the polysiloxane A further comprises a repeating unit represented by the formula (Ib):

(Ib)

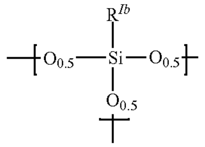

wherein, $R^{Ib}$ represents hydrogen, a $C_{1-30}$ linear, branched or cyclic, saturated or unsaturated, aliphatic hydrocarbon group or aromatic hydrocarbon group, the aliphatic hydrocarbon group and the aromatic hydrocarbon group may be each substituted with fluorine, hydroxy or alkoxy, and $—CH_2—$ in the aliphatic hydrocarbon group and the aromatic hydrocarbon group may be replaced with —O— or —CO—, provided that $R^{Ib}$ is neither hydroxy nor alkoxy.

3. The composition according to claim 1, wherein the total number of Si atoms of the formula (Ia) contained in the polysiloxane A is 1 to 15% based on the total number of Si atoms in the polysiloxane.

4. The composition according to claim 1, further comprising an acrylic resin and/or a polysiloxane B containing no repeating unit of the formula (Ia).

5. The composition according to claim 1, wherein the content of the polysiloxane A is 20 to 100 mass %, based on the total mass of all polymer contained in the composition.

6. A method for producing a cured film, comprising applying the composition according to claim 1 onto a substrate to form a coating film, exposing the coating film, and developing.

7. The method according to claim 6, further comprising a process of heating at a temperature of 70 to 130° C. after the development.

8. A cured film formed by the method according to claim 6.

9. An electronic device comprising the cured film according to claim 8.

* * * * *